United States Patent
Son et al.

[11] Patent Number: 6,103,562
[45] Date of Patent: Aug. 15, 2000

[54] METHOD OF MAKING SEMICONDUCTOR DEVICE WITH DECREASED CHANNEL WIDTH AND CONSTANT THRESHOLD VOLTAGE

[75] Inventors: Jeong Hwan Son, Taejeon-si; Young Gwan Kim, Chungcheongbuk-do, both of Rep. of Korea

[73] Assignee: LG Semicon Co., Ltd., Chungcheongbuk-Do, Rep. of Korea

[21] Appl. No.: 09/225,314

[22] Filed: Jan. 5, 1999

[30] Foreign Application Priority Data

Jan. 14, 1998 [KR]  Rep. of Korea ........................... 98-864

[51] Int. Cl.[7] ................................................ H01L 21/8238
[52] U.S. Cl. ............................ 438/217; 438/302; 438/919
[58] Field of Search ..................................... 438/217, 221, 438/224, 231, 232, 302, 525, 919

[56] References Cited

U.S. PATENT DOCUMENTS

| | | | |
|---|---|---|---|
| 4,943,537 | 7/1990 | Harrington, III | 438/217 |
| 5,413,945 | 5/1995 | Chien et al. | 438/217 |
| 5,834,347 | 11/1998 | Fukatsu et al. | 438/302 |

OTHER PUBLICATIONS

Schwalke, U. et al., "Extigate: The Ultimate Process Architecture for sub–0.25μm CMOS Technologies", Proceedings of the 26th European Solid State Device Research Conference, 1996, pp. 317–320.

*Primary Examiner*—Chandra Chaudhari
*Attorney, Agent, or Firm*—Morgan, Lewis & Bockius LLP

[57] ABSTRACT

Semiconductor device and method for fabricating the same, is disclosed, which can maintain a threshold voltage constant despite of decreased channel width, the device including a first, and a second conductive type wells in a substrate, a first, and a second gate insulating films on the first, and the second conductive type wells, a first gate electrode on the first gate insulating film, the first gate electrode being doped with a second conductive type except for edges of the first gate electrode in a channel width direction counter doped with a first conductive type, a second gate electrode on the second gate insulating film, the second gate electrode being doped with a first conductive type except for edges of the second gate electrode in a channel width direction counter doped with a second conductive type, and isolating regions formed between the first, and second conductive type wells, the first, and second gate insulating films, and the first, and second gate electrodes.

7 Claims, 7 Drawing Sheets

FIG.5H

METHOD OF MAKING SEMICONDUCTOR DEVICE WITH DECREASED CHANNEL WIDTH AND CONSTANT THRESHOLD VOLTAGE

BACKGROUND OF THE INVENTION

1. Field of the Invention

The present invention relates to a semiconductor device, and more particularly, to a semiconductor device and a method for fabricating the same which can maintain a threshold voltage constant despite of decreased channel width.

2. Discussion of the Related Art

Figure 1:
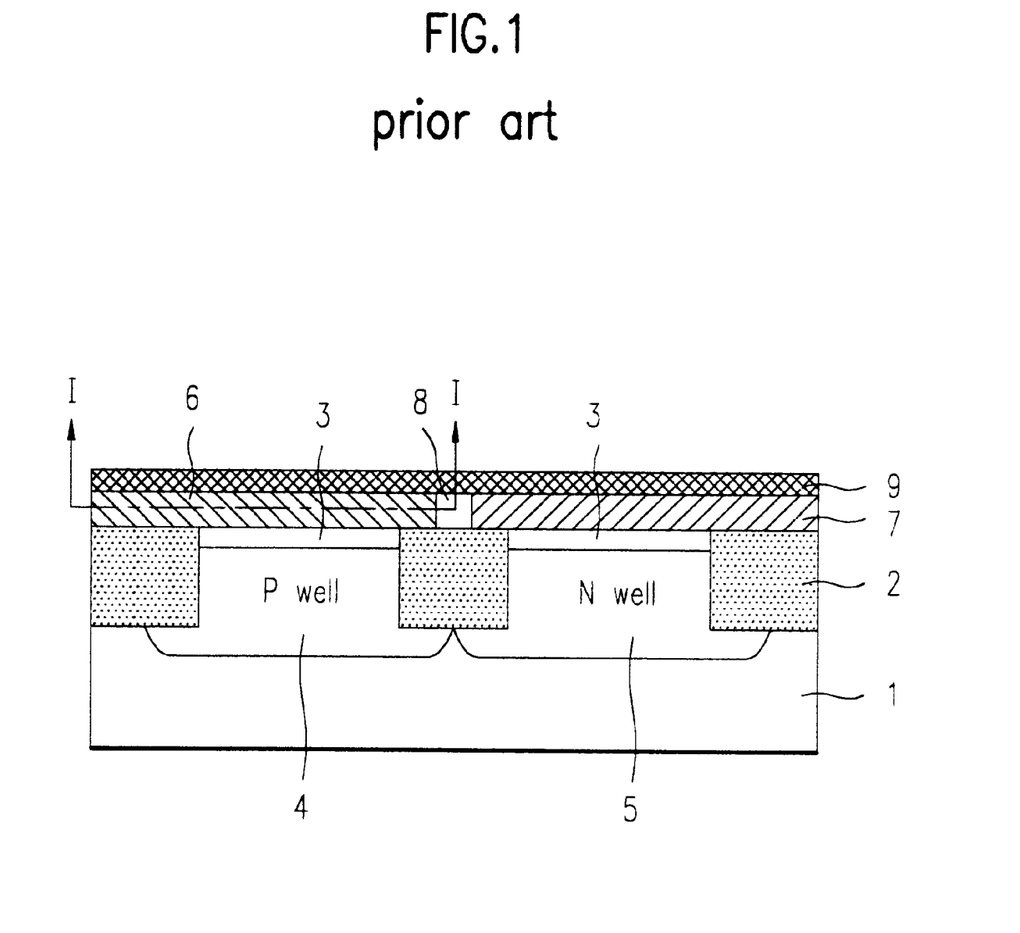
FIG. 1 illustrates a section of a background art semiconductor device.
Figure 2A:
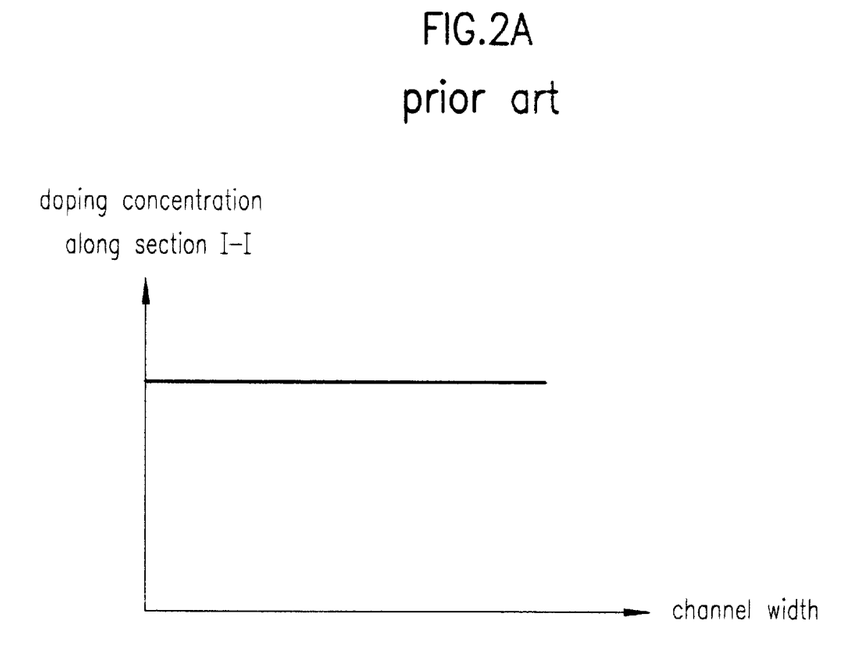
FIG. 2A illustrates a graph showing a doping concentration across a section along a line I—I in FIG. 1.
Figure 2B:
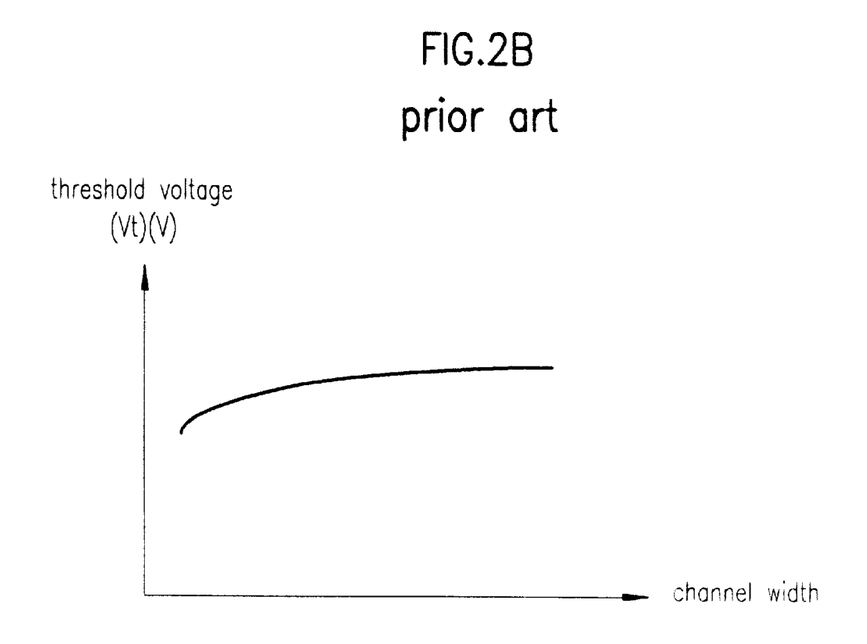
FIG. 2B illustrates a graph showing a channel width vs. a threshold voltage across a section along a line I—I in FIG. 1.

A background art semiconductor device will be explained with reference to the attached drawings. FIG. 1 illustrates a section of a semiconductor device fabricated according to a background art method, FIG. 2A illustrates a graph showing a relation between a channel width vs. a doping concentration, and FIG. 2B illustrates a graph showing a relation between a channel width vs. a threshold voltage.

The semiconductor device fabricated according to a background art method is provided with a P well 4 and an N well 5 in a semiconductor substrate 1 having active regions and field regions defined thereon. And, there are trench regions formed to isolate the P well 4 and the N well 5. There is a gate oxide film 3 on surfaces of the P well 4 and N well 5 between the trenches regions 2. There are doped polysilicon layers formed on the trench isolating regions 2 and the gate oxide film 3; the polysilicon layer on the P well 4 is a first gate electrode 6 doped with N type and the polysilicon on the N well 5 is a second gate electrode 7 doped with P type. And, there is a barrier film 8 on the trench isolating region 2 which isolates the P well 4 and the N well 5, for preventing dopant inter-diffusion between the first, and second gate electrodes 6 and 7. The barrier film 8 is formed of a material, such as titanium nitride TiN. And, there is a gate cap layer 9 of a metal or a metal silicide for reducing resistances of the first, and second gate electrodes 6 and 7. A doping concentration in a channel width portion of the first gate electrode 6 of the aforementioned semiconductor device across line I—I of FIG. 1 is found constant as shown in FIG. 2A. And, as shown in FIG. 2B, a threshold voltage Vt of the semiconductor device is dropped as the channel width is decreased, which is called inverse narrow width effect. The inverse narrow width effect is caused by the following reason; a threshold voltage drop at an edge of the active region due to a low doping concentration and a threshold voltage drop at an edge of the active region due to an increased effective gate field applied on the channel when the gate electrode is placed on the edge corner of the trench isolating region 2. Such a drop of threshold voltage at the edge region implies that the threshold voltage at the edge is lower than the threshold voltage at a center portion of the active region. Accordingly, the increase of a ratio of the edge region to a total channel width when the channel width is decreased drops the device threshold voltage.

Therefore, the background art semiconductor device has the following problem.

The background art semiconductor device is involved in a drop of overall device threshold voltage as the threshold voltage of an edge region drops due to a device channel width is decreased. This variation of the device threshold voltage with the channel width makes a circuit design difficult, and the variation of the threshold voltage with the channel width in fabrication degrades a circuit operation reliability.

SUMMARY OF THE INVENTION

Accordingly, the present invention is directed to a semiconductor device and a method for fabricating the same that substantially obviates one or more of the problems due to limitations and disadvantages of the related art.

An object of the present invention is to provide a method for fabricating a semiconductor device which can maintain a threshold voltage constant despite of reduction of a channel width.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor device includes a first, and a second conductive type wells in a substrate, a first, and a second gate insulating films on the first, and the second conductive type wells, a first gate electrode on the first gate insulating film, the first gate electrode being doped with a second conductive type except for edges of the first gate electrode in a channel width direction counter doped with a first conductive type, a second gate electrode on the second gate insulating film, the second gate electrode being doped with a first conductive type except for edges of the second gate electrode in a channel width direction counter doped with a second conductive type, and isolating regions formed between the first, and second conductive type wells, the first, and second gate insulating films, and the first, and second gate electrodes.

In other aspect of the present invention, there is provided a method for fabricating a semiconductor device, including the steps of (1) forming first, and second conductive type wells in prescribed regions of a substrate, respectively, (2) forming a first insulating film on the first, and second conductive type wells, (3) depositing an undoped semiconductor layer on the first insulating film, (4) injecting ions into the semiconductor layer on the first conductive type well, to form a second conductive type semiconductor layer, (5) injecting ions into the semiconductor layer on the second conductive type well, to form a first conductive type semiconductor layer, (6) forming a second insulating film of prescribed patterns on the first, and second conductive type semiconductor layers, (7) forming a first conductive type counter doping region on the second conductive type semiconductor layer under edges in a direction of a channel width and both sides of the second insulating film of the prescribed pattern on the second conductive type semiconductor layer, (8) forming a second conductive type counter doping region on the first conductive type semiconductor layer under edges in a direction of a channel width and both sides of the second insulating film of the prescribed pattern on the first conductive type semiconductor layer, (9) etching exposed portions of the first insulating film, and the first, and second counter doping regions using the second insulating film on the first, and second conductive wells as a mask to form first, and second gate electrodes, and the first, and second gate insulating films respectively, and etching exposed portions of the first, and second conductive type well to form trenches, (10) forming isolating and insulating films in the trenches, and (11) removing the second insulating film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 3:
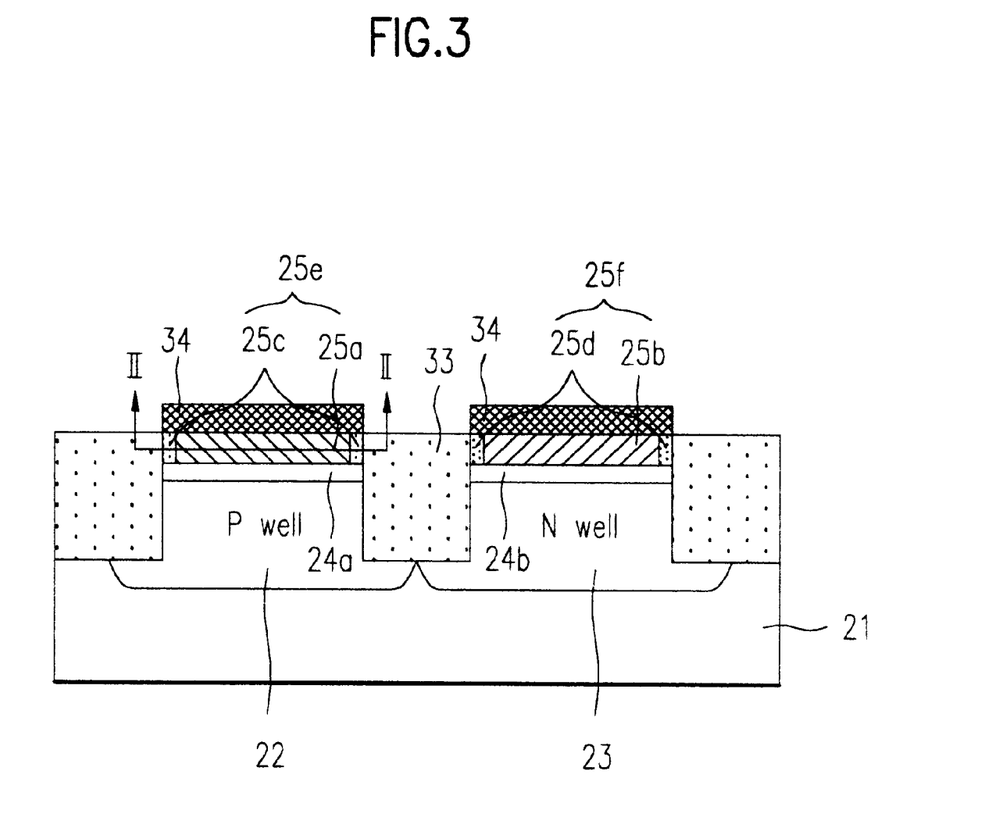
FIG. 3 illustrates a section of a semiconductor device in accordance with a preferred embodiment of the present invention.
Figure 4A:
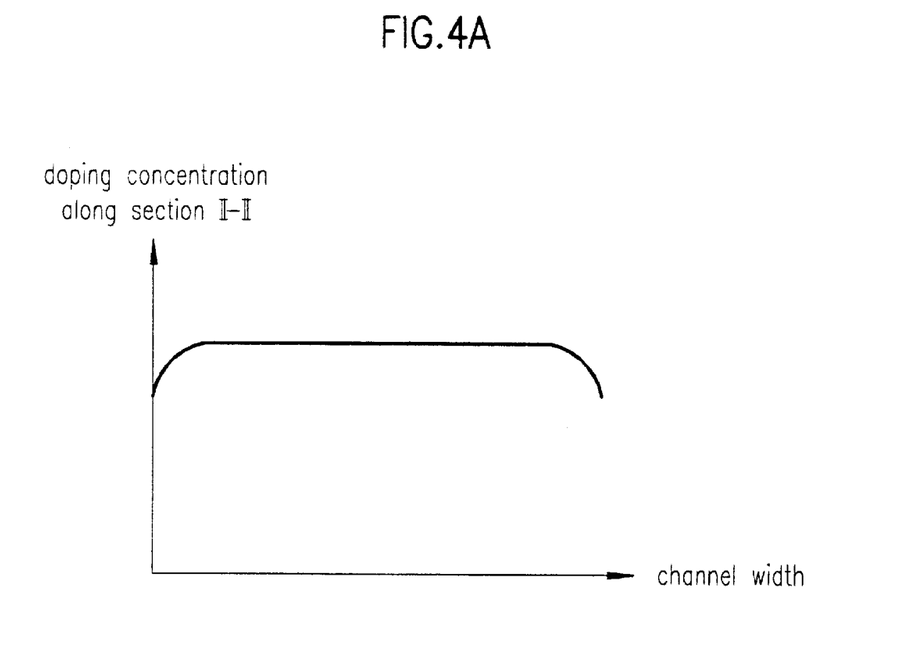
FIG. 4A illustrates a graph showing a doping concentration across a section along a line II—II in FIG. 3.
Figure 4B:
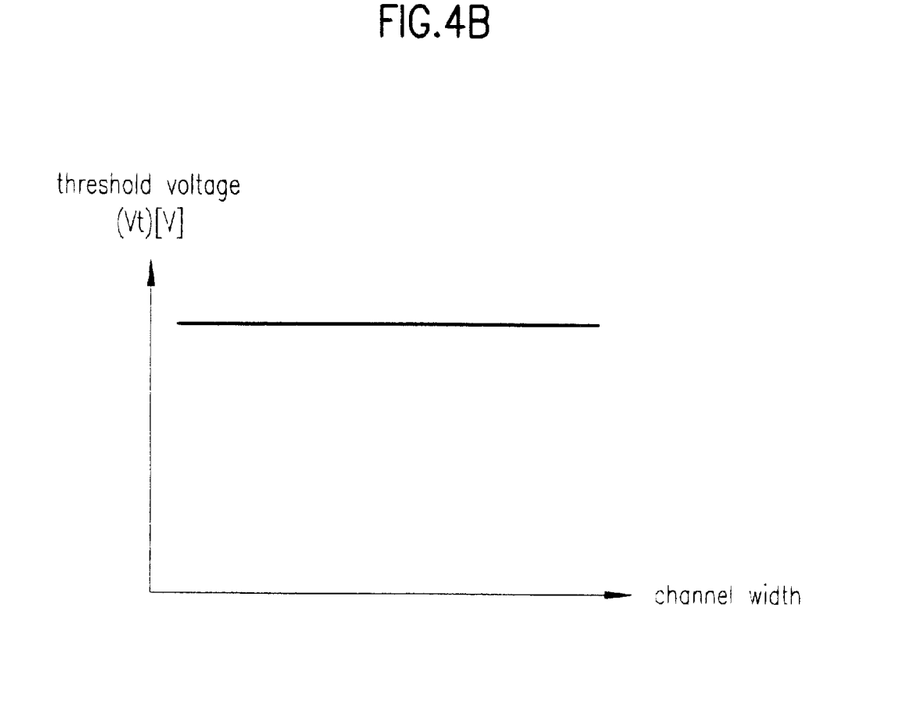
FIG. 4B illustrates a graph showing a channel width vs. a threshold voltage across a section along a line II—II in FIG. 3; and, FIGS. 5A~5H illustrates sections showing the steps of a method for fabricating a semiconductor device in accordance with a preferred embodiment of the present invention.

Reference will now be made in detail to the preferred embodiments of the present invention, examples of which are illustrated in the accompanying drawings. FIG. 3 illustrates a section of a semiconductor device in accordance with a preferred embodiment of the present invention, FIG. 4A illustrates a graph showing a relation between a channel width vs. a doping concentration, FIG. 4B illustrates a graph showing a relation between a channel width vs. a threshold voltage, and FIGS. 5A~5H illustrates sections showing the steps of a method for fabricating a semiconductor device in accordance with a preferred embodiment of the present invention.

Referring to FIG. 3, the semiconductor device in accordance with a preferred embodiment of the present invention includes a first conductive type well 22 and a second conductive type well 23 formed in a semiconductor substrate. The first conductive type well 22 is a P well and the second conductive type well 23 is an N well. There is an isolating region 33 between the first conductive type well 22 and the second conductive type well 23. And, there are a stack of a first gate insulating film 24a and a first gate electrode 25e between the isolating regions 33, and a stack of a second gate insulating film 24b and a second gate electrode 26f on the second conductive well 23 between the isolating regions 33. There are first conductive counter doping regions 25c formed at edge regions of the first gate electrode 25e, and second conductive counter doping regions 25d formed at edge regions of the second gate electrode 25f. There are metal silicide layers 34 formed on the first, and second conductive counter doping regions 25c and 25d. As shown in FIG. 4A, a doping concentration along a length of the channel width across line II—II in FIG. 3 of the first gate electrode 25e of the aforementioned semiconductor device shows low doping concentrations at the edge regions of the active region. This low doping concentrations at the edge regions, acting as if the first gate oxide film increase, can increase the device threshold voltage. And, as shown in FIG. 4b, the threshold voltage of the semiconductor device of the present invention exhibits a constant threshold voltage even when the channel width is reduced.

Figure 5A:
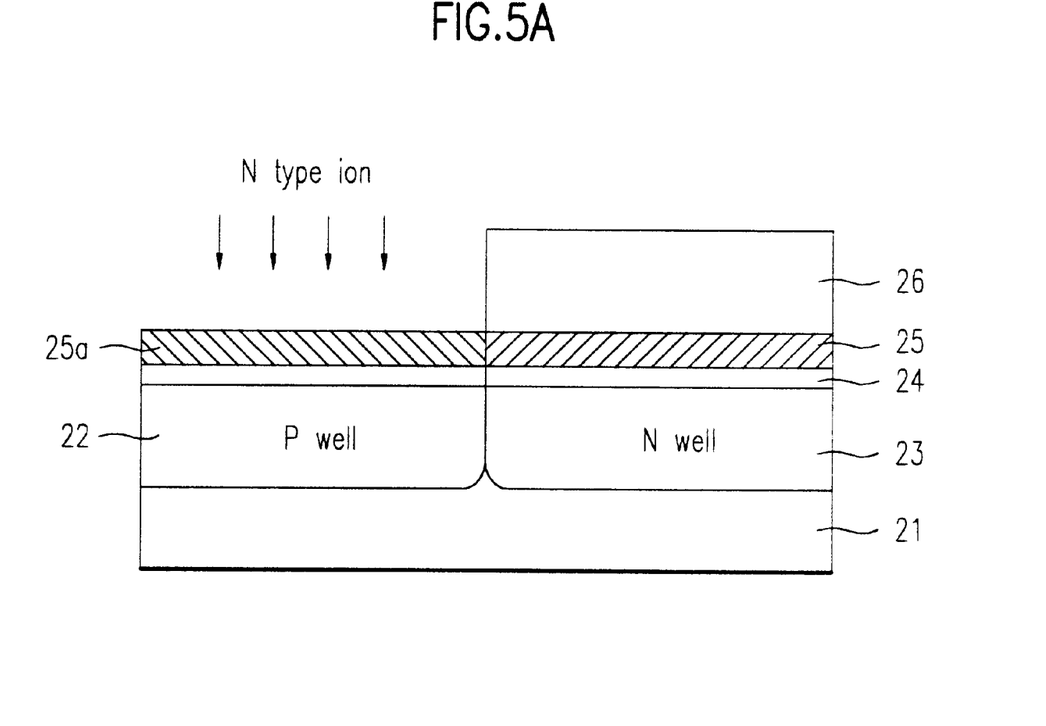
Figure 5B:
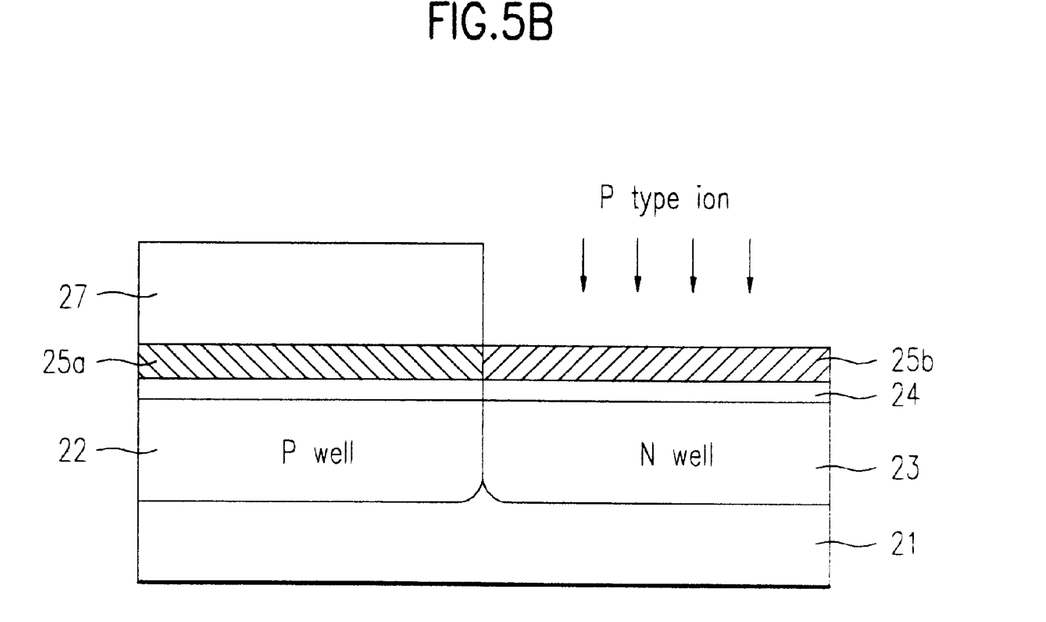
Figure 5C:
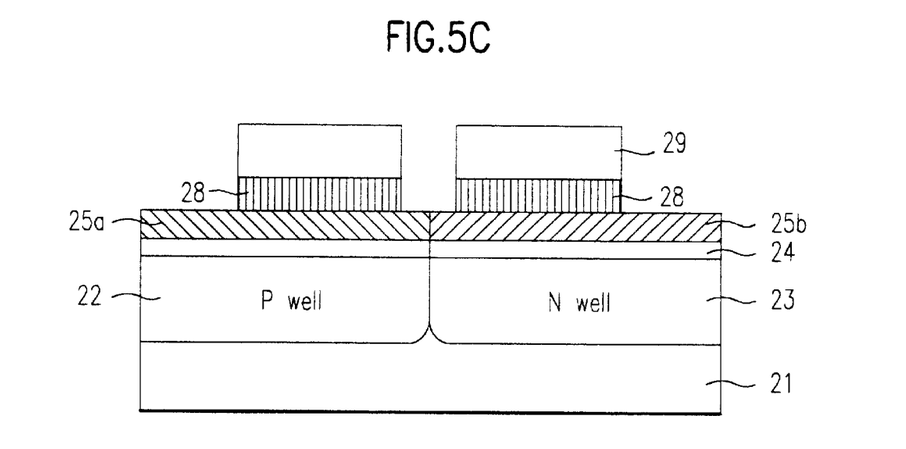
Figure 5D:
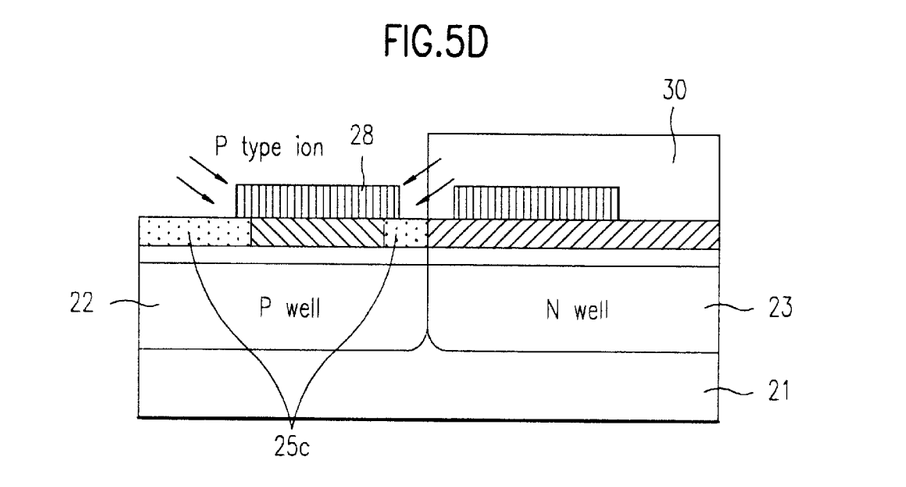
Figure 5E:
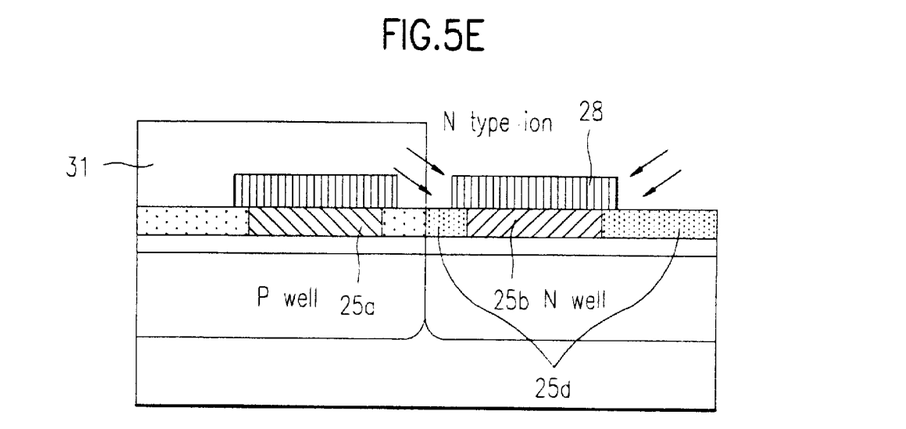
Figure 5F:
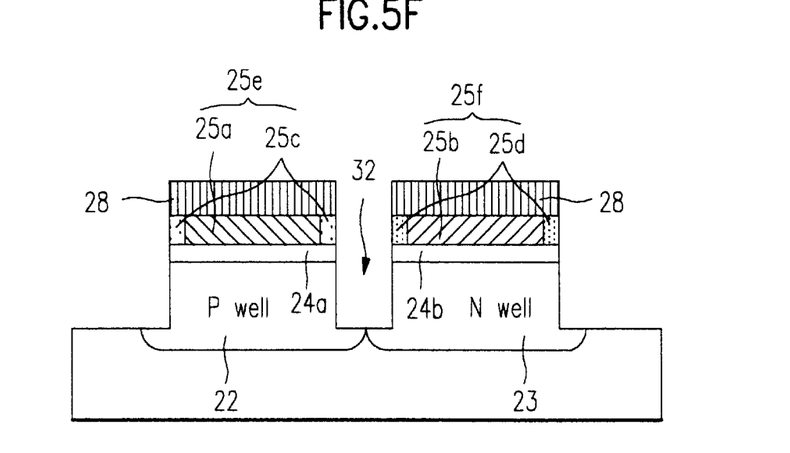
Figure 5G:
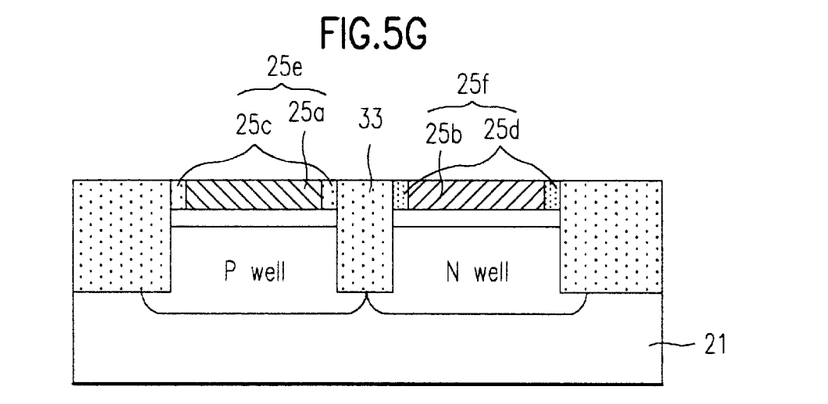
Figure 5H:
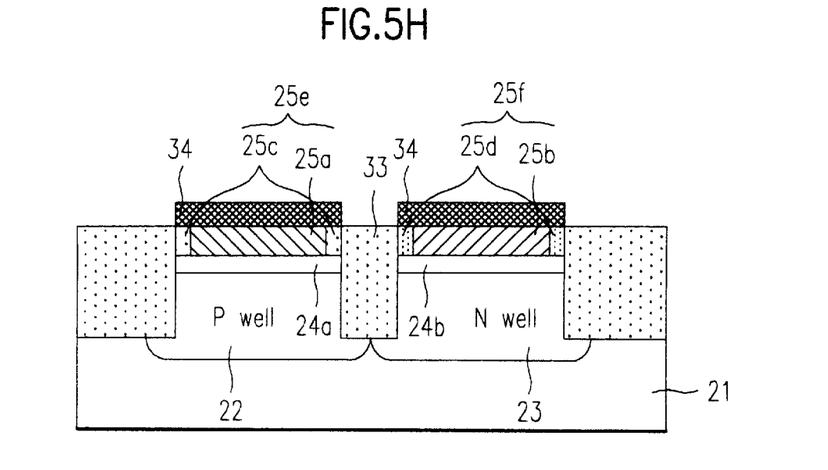

Referring to FIG. 5A, the method for fabricating a semiconductor device in accordance with a preferred embodiment of the present invention starts with injecting ions into a first conductive type well 22 and a second conductive type well 23 formed in a semiconductor substrate 21, for adjusting threshold voltages. The first conductive type well 22 is a P well and the second conductive type well 23 is an N well. Then, a first insulating film 24 is deposited by annealing or chemical vapor deposition on the semiconductor substrate 21 having the first conductive type well 22 and the second conductive type well 23 formed therein. The first insulating film is an oxide film. Then, an undoped semiconductor layer 25 is deposited on the first insulating film 24. The semiconductor layer is formed of polysilicon. Then, a first photoresist film 26 is coated and subjected to selective patterning by exposure and development, to expose the first conductive well 22. N type impurity ions are injected into the semiconductor layer 25 on the first conductive type well 22 using the patterned photoresist film 26 as a mask, to form a second conductive semiconductor layer 25a. Then, the first photoresist film 26 is removed. As shown in FIG. 5B, a second photoresist film 27 is coated on an entire surface of the semiconductor substrate 21 and subjected to patterning by exposure and development to expose the semiconductor layer 25 on the second conductive type well 23. And, P type impurity ions are injected into the semiconductor layer 25 on the second conductive type well 23 using the patterned second photoresist film 27 as a mask, to form a first conductive type semiconductor layer 25b. As shown in FIG. 5C, a second insulating film 28 to be used as a hard mask is deposited on an entire surface of the semiconductor substrate 21, and a third photoresist film 29 is coated on the second insulating film 28 and subjected to selective patterning by exposure and development, to expose edges of the second conductive type semiconductor layer 25a and the first conductive type semiconductor layer 25b. The second insulating film is formed of an oxide or a nitride which can serve as a hard mask. Then, the second insulating film 28 is subjected to anisotropic etching using the patterned third photoresist film 29 as a mask. As shown in FIG. 5D, a fourth photoresist film 30 is deposited on an entire surface and subjected to selective patterning by exposure and development to leave the fourth photoresist film 30 only on the second conductive type well 23. Then, P type impurity ions are tilt injected into edges of the second conductive type semiconductor layer 25a using the patterned fourth photoresist film 30 and the second insulating film 28 on the first conductive type well 22 as masks such that the P type impurity ions are doped under all edges of the second insulating film 28, to form a first conductive type counter doping region 25c. The P type ions are injected at an angle below 30° with a dose of $1E^{14}$~$1E^{15}$/cm². As shown in FIG. 5E, a fifth photoresist film 31 is deposited on an entire surface and subjected to selective patterning by exposure and development to leave the fifth photoresist film only on the first conductive type well 22. Then, N type impurity ions are tilt injected into edges of the first conductive type semiconductor layer 25b using the patterned fifth photoresist film 31 and the second insulating film 28 on the second conductive type well 23 as masks such that the N type impurity ions are doped under all edges of the second insulating film 28, to form a second conductive type counter doping region 25d. The N type ions are injected at an angle below 30° with a dose of $1E^{14}$~$E^{15}$/cm². With dopings thus conducted, the first conductive type counter doping region 25c and the second conductive type counter doping region 25d are formed in edges of the second conductive type semiconductor layer 25a and the first conductive type semiconductor layer 25b respectively, obtaining a first conductive semiconductor layer 25a and a second conductive type polysilicon layer 25b, each having a doping concentration higher at a center portion than edge portions. As shown in FIG. 5F, the second conductive type counter doping region 25c, the first conductive type counter doping region 25d and the first insulating film 24 as well as to a depths of the P well 22 and the N well 23 are etched to form trenches 32 which isolates the first gate insulating film 24a and the second gate insulating film 24b, and the first gate electrode 25e and the second gate electrode 25f. The first gate electrode 25e is formed with the second conductive type semiconductor layer 25a and the first conductive type counter doping region 25c, and the second gate electrode 25f is formed with the first conductive type semiconductor layer 25b and the second conductive type counter doping region 25d. As shown in FIG. 5G, a third insulating film is formed on an entire surface of the semiconductor substrate 21 inclusive of the trenches and subjected to chemical mechanical polishing down to a level of the second insulating film 28, the third insulating film, the first, and second gate electrode 25e and 25f, to form isolating regions 33. As shown in FIG. 5H, a metal layer is deposited on an entire surface for reducing resistances of the first, and second gate electrodes 25e and 25f and annealed, to form metal silicide layers 34, and the metal layer which made no silicide reaction is removed.

The method for forming a semiconductor device of the present invention has the following advantages.

The lowering of doping concentrations in edge regions of the first and second gate electrodes of polysilicon layers doped in N type and P type respectively, by doping the edge regions with P and N conductivity types respectively, which are opposite to the conductivity types of respective gate electrodes, allows to maintain the device threshold constant.

Second, as the formation of the P, and N type counter doping regions in edge regions of the first and second gate electrodes respectively in self-alignment and as active regions is applicable even to a device of a high device packing density with an ultra narrow width, the present invention allows formation of a semiconductor device in a high device packing density.

It will be apparent to those skilled in the art that various modifications and variations can be made in the semiconductor device and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor device, comprising the steps of:

(1) forming first, and second conductive type wells in prescribed regions of a substrate, respectively;

(2) forming a first insulating film on the first, and second conductive type wells;

(3) depositing an undoped semiconductor layer on the first insulating film;

(4) injecting ions into the semiconductor layer on the first conductive type well, to form a second conductive type semiconductor layer;

(5) injecting ions into the semiconductor layer on the second conductive type well, to form a first conductive type semiconductor layer;

(6) forming a second insulating film of prescribed patterns on the first, and second conductive type semiconductor layers;

(7) forming a first conductive type counter doping region on the second conductive type semiconductor layer under edges in a direction of a channel width and both sides of the second insulating film of the prescribed pattern on the second conductive type semiconductor layer;

(8) forming a second conductive type counter doping region on the first conductive type semiconductor layer under edges in a direction of a channel width and both sides of the second insulating film of the prescribed pattern on the first conductive type semiconductor layer;

(9) etching exposed portions of the first insulating film, and the first, and second counter doping regions using the second insulating film on the first, and second conductive wells as a mask to form first, and second gate electrodes, and the first, and second gate insulating films respectively, and etching exposed portions of the first, and second conductive type well to form trenches;

(10) forming isolating and insulating films in the trenches; and, (11) removing the second insulating film.

2. A method as claimed in claim 1, wherein the second, and first conductive type counter doping regions of the first, and second conductive type semiconductor layers respectively are formed at an angle of 0°~30°.

3. A method as claimed in claim 1, further comprising the step of forming metal layers on the first, and second gate electrodes.

4. A method as claimed in claim 1, wherein the isolating and insulating films are planarized by chemical mechanical polishing.

5. A method for fabricating a semiconductor device, comprising the steps of:

(1) forming first conductive type well in a prescribed region of a substrate;

(2) forming a first insulating film on the first conductive type well;

(3) depositing an undoped semiconductor layer on the first insulating film;

(4) injecting ions into the semiconductor layer to form a second conductive type semiconductor layer;

(5) forming a second insulating film of a prescribed pattern on the second conductive semiconductor layer;

(6) forming a first conductive type counter doping region in the second conductive type semiconductor layer under edges in a direction of a channel width and both sides of the second insulating film of the prescribed pattern;

(7) etching exposed portions of the first conductive type counter doping region and the first insulating film using the second insulating film as a mask to form a gate electrode, and a gate insulating film; and, (8) removing the second insulating film.

6. A method as claimed in claim 5, wherein the first conductive type counter doping region of the second conductive type semiconductor layer is formed by a tilted ion injection at a tilt angle of 0°~30°.

7. A method as claimed in claim 5, further comprising the step of forming a conductive layer on the gate electrode.

* * * * *